United States Patent
Yeh et al.

(10) Patent No.: US 6,853,043 B2
(45) Date of Patent: Feb. 8, 2005

(54) NITROGEN-FREE ANTIREFLECTIVE COATING FOR USE WITH PHOTOLITHOGRAPHIC PATTERNING

(75) Inventors: Wendy H. Yeh, Mountain View, CA (US); Sang Ahn, San Mateo, CA (US); Christopher Dennis Bencher, Sunnyvale, CA (US); Hichem M'Saad, Santa Clara, CA (US); Sudha Rathi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/288,123

(22) Filed: Nov. 4, 2002

(65) Prior Publication Data

US 2004/0087139 A1 May 6, 2004

(51) Int. Cl.$^7$ .......................................... H01L 31/0232
(52) U.S. Cl. ...................... 257/437; 257/774; 438/72; 438/637; 438/638; 438/700
(58) Field of Search ................................ 438/636–638, 438/72, 700; 257/437, 760, 774

(56) References Cited

U.S. PATENT DOCUMENTS

| | | |
|---|---|---|
| 5,750,442 A | 5/1998 | Juengling |
| 5,981,401 A | 11/1999 | Torek et al. |
| 6,051,282 A | 4/2000 | Konjuh et al. |
| 6,083,852 A | 7/2000 | Cheung et al. |
| 6,103,456 A | 8/2000 | Tobben et al. |
| 6,156,149 A | 12/2000 | Cheung et al. |
| 6,171,764 B1 | 1/2001 | Ku et al. |
| 6,177,131 B1 * | 1/2001 | Glaubitt et al. ............. 427/162 |
| 6,214,526 B1 | 4/2001 | Sundararajan et al. |
| 6,573,030 B1 | 6/2003 | Fairbairn et al. |
| 2001/0044221 A1 | 11/2001 | Sandhu et al. |

FOREIGN PATENT DOCUMENTS

JP 2002-012972 1/2002

* cited by examiner

*Primary Examiner*—Hsien-Ming Lee
(74) *Attorney, Agent, or Firm*—Townsend & Townsend & Crew (57) ABSTRACT

A layer of antireflective coating (ARC) material for use in photolithographic processing. In one embodiment the ARC material has the formula $Si_wO_xH_y:C_z$, where w, x, y and z represent the atomic percentage of silicon, oxygen, hydrogen and carbon, respectively, in the material and where w is between 35 and 55, x is between 35 and 55, y is between 4 and 15, z is between 0 and 3 and the atomic percentage of nitrogen in the material is less than or equal to 1 atomic percent.

32 Claims, 6 Drawing Sheets

NITROGEN-FREE ANTIREFLECTIVE COATING FOR USE WITH PHOTOLITHOGRAPHIC PATTERNING

BACKGROUND OF THE INVENTION

The evolution of integrated circuits has seen a continuing decrease in the size of features that are fabricated in and on semiconductor wafers. Photolithographic processes are one of many fabrication steps critical in forming such small feature size structures. Conventional photolithographic techniques include forming a layer of energy sensitive resist over a material stack formed on a substrate. An image of a pattern is introduced into the energy sensitive resist layer by directing radiation through an appropriately patterned photomask. The substrate is then exposed to a chemical etchant to transfer the pattern introduced into the energy sensitive resist layer into one or more layers of the material stack. The chemical etchant is selected to have a greater etch selectivity for the material layers of the stack than for the energy sensitive resist. That is, the chemical etchant etches the one or more layers of the material stack at a faster rate than it etches the energy sensitive resist. The faster etch rate for the one or more material layers of the stack typically prevents the energy sensitive resist material from being consumed prior to completion of the pattern transfer.

Photolithographic processes used in the manufacture of many modern integrated circuits (e.g., integrated circuits having minimum features sizes of about 0.35 microns or less) employ deep ultraviolet (DUV) imaging wavelengths (e. g., wavelengths of 248 nm or 193 nm) to generate the resist patterns. The DUV imaging wavelengths improve resist pattern resolution because diffraction effects are reduced at these shorter wavelengths. The increased reflective nature of many underlying materials (e. g., polysilicon and metal silicides) at such DUV wavelengths, however, may degrade the resulting resist patterns.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

Layers of inorganic material such as silicon oxynitride, titanium nitride and others have been predominately used by the industry as ARCs for deep UV radiation. One problem with such ARCs, however, is that amines ($NH_2$ groups) may form on the surface of the layer. The exposure of photoresists that are typically used with deep UV radiation generally creates an acidic reaction in the photoresist. The resulting acid compounds then react with the developer to create a mask. Since the amines formed at the surface of the inorganic ARC layer are basic, they tend to neutralize the acids generated by the exposure of the photoresist and thereby limit the development of the photoresist. This problem, which is often referred to as "resist poisoning" or "footing" may result in small foot-like portions of resist that are left undeveloped near the interface between the ARC and resist and ultimately interfere with the patterning of features underneath the photoresist.

A variety of different techniques have been developed to address the footing issue. One technique devised minimizes or eliminates the formation of amines at the ARC/photoresist interface by forming a silicon dioxide cap layer over the ARC before the photoresist is deposited. Another technique reduces amine formation by exposing the ARC to a plasma of reactive oxygen species prior to forming the photoresist layer. Basically, it is believed that exposure to reactive oxygen forms a thin layer of $SiO_2$ at the surface of the ARC which prevents amines from migrating into the subsequently deposited photoresist material.

Figure 1A:
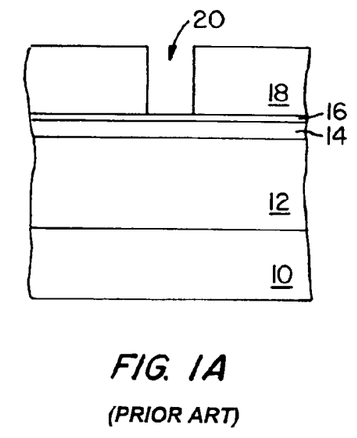
FIGS. 1A–1D illustrate an exemplary damascene etch sequence that is commonly used in the formation of integrated circuits having copper signal lines according to previously known techniques.

Despite the development of these and other techniques to reduce footing, there are some situations in which new techniques to minimize resist poisoning are desirable. For example, FIGS. 1A–1D illustrate an exemplary damascene etch sequence that is commonly used in the formation of integrated circuits having copper signal lines. In FIG. 1A a dielectric layer 12 is formed over a substrate 10. As shown in subsequent figures, dielectric layer 12 will have a via and a signal line trench formed in it as part of the interconnect structure of an integrated circuit. An ARC 14 is formed over dielectric layer 12 and a thin oxide layer 16 is created on the surface of ARC 14. A photoresist layer 18 is formed over ARC 14 and patterned according to a via pattern 20.

Figure 1B:
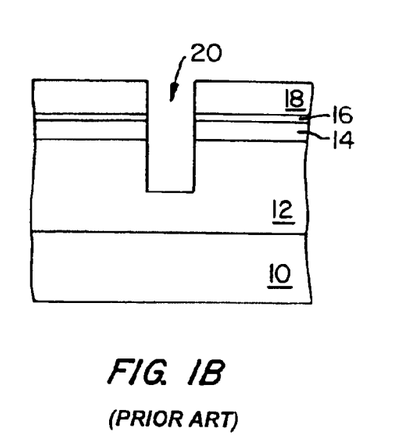
Figure 1C:
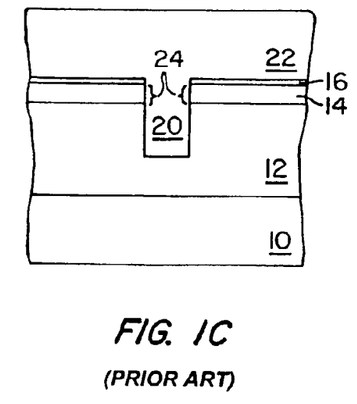

In FIG. 1B the via pattern 20 is transferred into dielectric layer 12 using any appropriate etch sequence as is known to those of skill in the art. This etch step also removes a portion of photoresist layer 18 as shown in FIG. 1B. Next, photoresist layer 18 is stripped and a new photoresist layer 22 is formed over the substrate. As shown in FIG. 1C, photoresist layer 22 fills the partially etched via and contacts sidewall areas 24 of ARC 14.

Figure 1D:
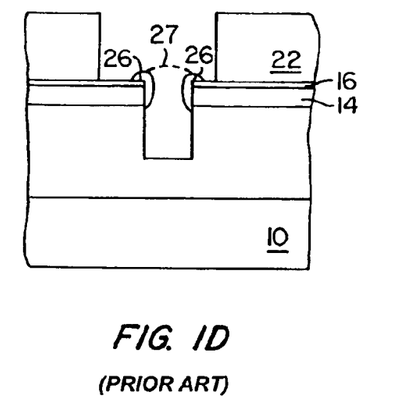

Next, photoresist layer 22 is patterned according to a trench pattern. As shown in FIG. 1D, however, amines migrate from the sidewall of ARC 14 into photoresist layer 22 interfering with the development of the layer. The resulting developed structure may include undeveloped regions of photoresist along the sidewalls of the initially etched via pattern as shown by photoresist portions 26 in FIG. 1D. In some instances the area of undeveloped resist may be sufficiently large to form a bubble 27 as shown in dashed lines.

Accordingly, new and different techniques of forming ARC layers are desirable.

BRIEF SUMMARY OF THE INVENTION

Embodiments of the invention pertain to methods of forming antireflective coatings (ARCs) that are substantially free of nitrogen and thus do not harbor amines that may migrate from the layer into an adjacent photoresist layer. Such nitrogen-free ARCs are particularly useful in photolithographic patterning processes that employ chemically amplified photoresists that are prone to resist poisoning. Embodiments of the invention are particularly useful in the patterning of material using deep UV radiation of 248, 193 or 157 nm and e-beam radiation but are also believed to be useful in other patterning processes.

According to one embodiment of the invention, a layer of antireflective coating (ARC) material for use in photolithographic processing is provided. The ARC material can be represented by the formula $Si_wO_xH_y:C_z$, where w, x, y and z represent the atomic percentage of silicon, oxygen, hydrogen and carbon, respectively, in the material and where w is between 35 and 55, x is between 35 and 55, y is between 4 and 15, z is between 0 and 3 and the amount of nitrogen in the material is less than or equal to 1 atomic percent.

According to another embodiment, a method for fabricating an integrated circuit is provided. The method comprises depositing an antireflective coating (ARC) over a substrate using a chemical vapor deposition process, forming a layer of photoresist over the ARC and then patterning the photoresist layer. The ARC can be represented by the formula $Si_wO_xH_y:C_z$, where w, x, y and z represent the atomic percentage of silicon, oxygen, hydrogen and carbon, respectively, in the ARC and where w is between 35 and 55, x is between 35 and 55, y is between 4 and 15, z is between 0 and 3 and the amount of nitrogen in the ARC is less than or equal to 1 atomic percent.

In some embodiments, the ARC is a multilayer coating that comprises a first layer that has a first extinction coefficient and a second layer, deposited over the first layer, that has a second extinction coefficient that is lower than the first extinction coefficient. In some specific embodiments the first extinction coefficient is between about 0.4 to 1.1 inclusive and the second extinction coefficient is between about 0.1 to 0.5 inclusive.

In additional embodiments the ARC is formed over a hard mask layer and/or a capping layer is formed over the ARC. In one embodiment the hard mask layer is an amorphous carbon layer and the capping layer is a silicon dioxide capping layer. In another embodiment the hard mask may be a silicon nitride layer or a polysilicon layer.

These and other embodiments of the invention along with many of its advantages and features are described in more detail in conjunction with the text below and attached figures.

DETAILED DESCRIPTION OF THE INVENTION

Embodiments of the invention pertain to methods of forming antireflective coatings (ARCs) that are substantially free of nitrogen. Such nitrogen-free ARCs are particularly useful in photolithographic patterning processes that employ chemically amplified resists, the proper development of which depends on the catalytic effect of photo-generated acid. ARCs formed according to embodiments of the invention incorporate minimal amounts of nitrogen into the coating and are thus less likely to interfere with the formation of acid in the resist than many other ARCs.

Antireflective coatings according to embodiments of the invention can be deposited using chemical vapor deposition techniques and are silicon-rich, nitrogen-free films. Previously known silicon dioxide, silicon nitride and silicon oxynitride ARCs typically contain between 30–35 percent atomic silicon while previously known silicon nitride, silicon oxynitride and titanium nitride ARCs typically contain between 5–20 atomic percent nitrogen. In contrast, ARCs according to various embodiments of the present invention include between 35–55 atomic percent (at. %) silicon and less than or equal to 1 at. % nitrogen.

The amount of silicon incorporated into the coating has a direct effect on the extinction coefficient (k) of the ARC. Too little silicon results in a transparent film with a very low extinction coefficient. The extinction coefficient of the ARC is also dependent upon its hydrogen content among other factors. Generally, higher hydrogen levels result in higher extinction coefficients. Nitrogen incorporated into the film, on the other hand, may migrate into adjacent photoresist material and interfere with development of the photoresist. Thus, it is desirable to ensure as little nitrogen as possible gets incorporated into the film. In some embodiments, ARCs according to the invention include between 40–45 at. % silicon, between 6–13 at. % hydrogen, less than or equal to 0.1 at. % nitrogen and between 40 and 54 at. % oxygen.

Nitrogen-free ARCs according to embodiments of the invention can generally be represented by the formula $Si_wO_xH_y:C_z$, where w, x, y and z represent the atomic percentage of silicon, oxygen, hydrogen and carbon, respectively, with w being between 35 and 55, x being between 35 and 55, y being between 4 and 15 and z being between 0 and 3.

A nitrogen-free ARC according to embodiments of the invention can be formed by a plasma CVD reaction of a silicon source and an oxygen source. In some embodiments an inert gas such as helium is also added to stabilize the plasma and control the deposition rate. In one specific embodiment a nitrogen-free ARC is formed by forming a plasma from a gaseous mixture of monosilane ($SiH_4$), carbon dioxide ($CO_2$) and helium (He). Such a deposition process beneficially incorporates a small amount of carbon into the film, which also helps raise the extinction coefficient of the ARC. The carbon content of the ARC can be varied between about 1–3 at. %, depending on deposition conditions, when $CO_2$ is used as the oxygen source gas source.

The nitrogen-free ARC material according to the present invention can be deposited to have, at deep UV radiation wavelengths, a refractive index (n) of between about 1.5 to 2.0 inclusive and an extinction coefficient (k) of between about 0.1 and 1.1 inclusive. In some specific embodiments the extinction coefficient can be varied significantly (e.g., between about 0.3 and 1.0) over a narrow refractive index range of between 1.6 and 1.8 inclusive. This is particularly beneficial when depositing multiple ARC layers with different extinction coefficients as discussed below.

In order to better appreciate and understand the present invention, an example of its use is set forth below in the formation of a via-first dual damascene structure. This example is described with respect to FIG. 2, which is a flow chart depicting the processing steps discussed in the example, and FIGS. 3A–3G, which are simplified cross-sectional views of a substrate processed according to the steps depicted in FIG. 2. It is to be understood that the example of FIGS. 2 and 3A–3G is for exemplary purposes only. The nitrogen-free ARC material according to embodiments of the present invention can be used to form a variety of different structures in dielectric layers or dielectric stacks including, for example, trench-first dual damascene structures and single damascene structures among others. The nitrogen-free ARC material according to embodiments of the invention can also be used in the photolithographic patterning of other types of materials and/or material stacks including, for example, patterning polysilicon gates and patterning aluminum lines among others.

Figure 2:
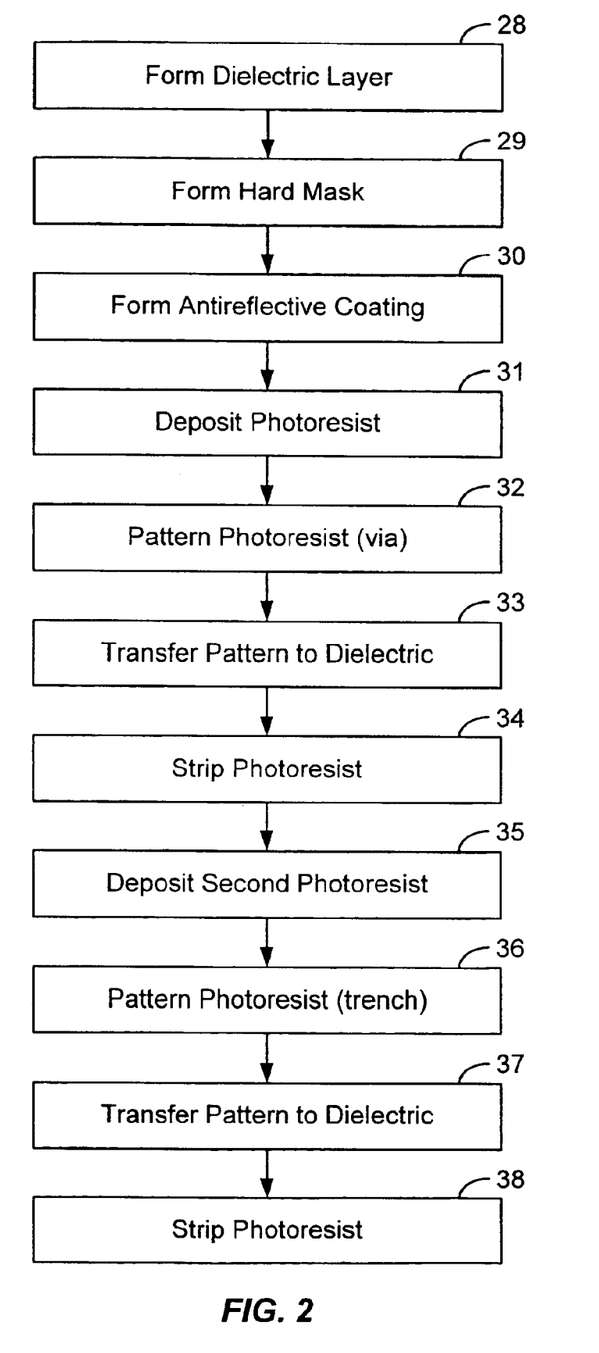
FIG. 2 is a flowchart illustrating the steps associated with forming an integrated circuit according to one embodiment of the method of the present invention.
Figure 3A:
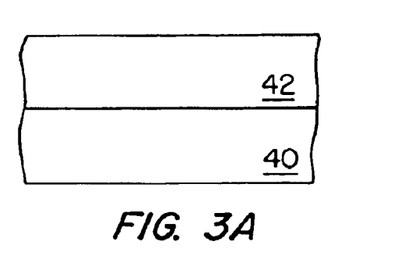
FIGS. 3A–3G are simplified cross-sectional views of a substrate being processed according to the sequence of steps set forth in FIG. 2.

Referring to FIG. 2, this example starts with the formation of a dielectric layer 42 over a substrate 40 (step 28 and FIG. 3A). Substrate 40 may be any suitable substrate material upon which semiconductor devices are formed, such as a silicon substrate, a germanium substrate, a silicon-germanium substrate and the like. Substrate 40 may also include a plurality of already formed layers over the base substrate material. Dielectric layer 42 may be a single layer of insulative material or may be a stack of layers. In one embodiment dielectric layer 42 includes an etch stop dielectric layer deposited directly on substrate 40 as well as separate via and trench dielectric layers as is known to those of skill in the art. In one specific embodiment layer 42 includes a carbon-doped silicon oxide layer, such as a Black Diamond™ layer available through Applied Materials assignee of the present invention, deposited over a silicon carbide layer, such as a BloK™ layer also available through Applied Materials. The Black Diamond™ layer is the primary dielectric layer in which both a trench and via structure are formed while the BloK™ layer is a bottom etch stop layer.

Next, an optional hard mask layer 44 is formed over dielectric layer (step 29). Hard mask layer can be, for example, a silicon nitride layer, but in some embodiments it is a nitrogen-free layer, such as a silicon carbide layer (SiC or SiCH) or an amorphous carbon layer in order to avoid resist poisoning. In one particular embodiment, hard mask layer 44 is an amorphous carbon layer that has a hydrogen content of between about 10–60 at. %. Such an amorphous layer can be deposited by thermally decomposing a gaseous mixture comprising a hydrocarbon and an inert gas as described in detail in U.S. patent application Ser. No. 09/590,322; filed Jun. 8, 2000, entitled "Method of Depositing an Amorphous Carbon Layer" having Kevin Fairbaim et al. listed as coinventors which is thereby incorporated by reference in its entirety.

Figure 3B:
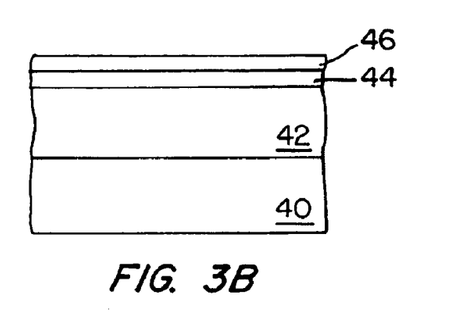

A layer of nitrogen-free antireflective coating material 46 according to the present invention is then formed over hard mask 44 (or over dielectric layer 42 if no hard mask layer is employed) (step 30). FIG. 3B shows dielectric layer 42, hard mask 44 and ARC 46 deposited over substrate 40. Nitrogen-free ARC 46 can be deposited according to a variety of different CVD processes. In one embodiment, ARC 46 is deposited using a plasma enhanced CVD process in a DxZ chamber manufactured by Applied Materials using the parameters set forth in Table 1 below. In some embodiments both high and low frequency RF power are used to form a plasma to deposit a nitrogen free ARC film having improved pinhole characteristics and an increased density.

TABLE 1

Exemplary Deposition Conditions for ARC 46

| Deposition Parameter | Exemplary Range |
|---|---|
| SiH$_4$ flow | 5–200 sccm |
| CO$_2$ flow | 1000–10000 sccm |
| He flow | 0–10000 sccm |
| Temperature | 300–550° C. |
| Pressure | 2–10 Torr |
| Spacing | 210–800 mils |
| RF Power (13.56 MHz) | 25–1000 W |

Figure 3C:
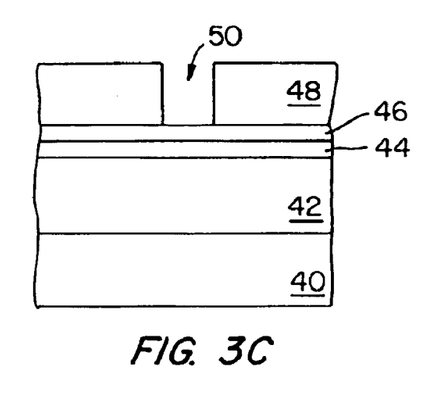

Referring now to FIG. 3C, a photoresist layer 48 is then formed over ARC 46 (step 31) and patterned using appropriate radiation as is known to those of skill in the art (step 32). In one embodiment, photoresist layer 48 is patterned using deep UV radiation having a wavelength of about 243, 198 or 157 nm. In another embodiment, layer 48 is patterned using e-beam radiation. Since this example is for a via-first dual damascene application, layer 48 is patterned in step 32 using a via pattern 50. It is to be understood, however, that any desired pattern could be transferred into layer 48 and then subsequently transferred into the underlying layers.

Next, the pattern is then transferred into the film stack beneath the photoresist material (step 33). The transfer of pattern 50 into the underlying film stack can be accomplished using any appropriate etching technique, such as exposing the substrate to a plasma of reactive fluorine species. The precise chemistry of the etching step as well as the etching conditions will depend on the material of the layers being etched as is known to those of skill in the art. Typically, an etch chemistry is selected that removes material exposed to the plasma that is desired to be etched (e.g., the dielectric material in the via location) at a significantly faster rate than it removes material exposed to the plasma that is not intended to be etched (e.g., portions of ARC layer 46 outside the via region).

Figure 3D:
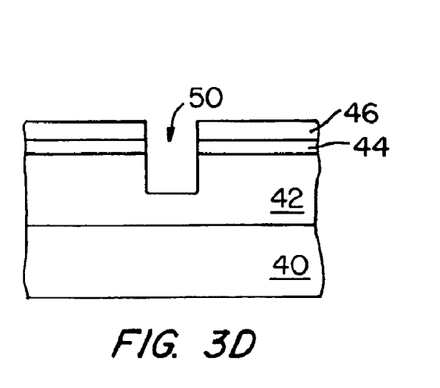

After patterning transferring via pattern 50 into the film stack beneath photoresist layer 48, the photoresist layer is stripped using an appropriate photoresist ashing process (step 34) as is known to those of skill in the art. The resulting substrate is shown in FIG. 3D. In some embodiments layer 48 is stripped after the via pattern is transferred into hard mask layer 44 while in other embodiments, layer 48 is stripped after transferring via pattern 50 into dielectric layer 42.

Figure 3E:
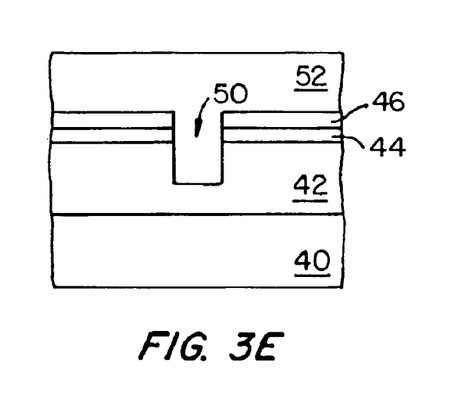
Figure 3F:
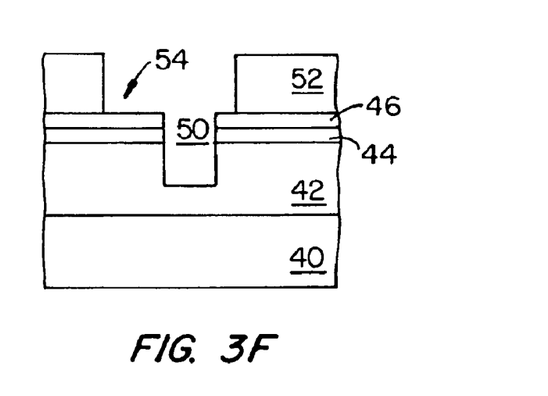

After the via pattern is etched to a desired depth in dielectric layer 42, a second photoresist layer 52 is deposited over the substrate (step 35) and patterned according to a trench pattern (step 36). During the photoresist development portion of the patterning process, photoresist comes in contact with the exposed sidewall areas 53 of ARC 46. Since ARC 46 contains only trace levels of nitrogen, however, there are few or no amine groups that migrate from the ARC to the photoresist layer and interfere with the development process. Thus, the problem of portions of undeveloped photoresist discussed above with respect to FIG. 1D is avoided and a successful transfer of the trench pattern into photoresist layer 52 occurs as shown in FIG. 3F.

Figure 3G:
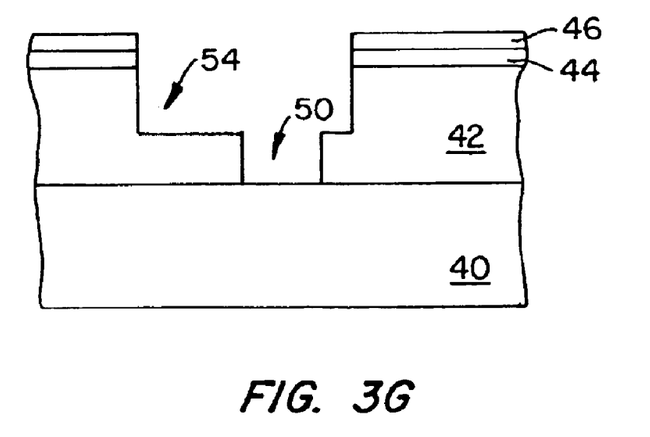

Next, trench pattern 54 is transferred into the film stack underlying photoresist layer 53 using an appropriate etching technique as discussed above with respect to step 33 (step 37). Finally, as shown in FIG. 3G, the remaining photoresist is stripped (step 38) and the substrate is ready to have a conductive material, such as copper, deposited in the via and trench areas.

While the example described above used a single layer of ARC material 46, other embodiments of the invention may employ two or more separate layers stacked on top of each other. For example, in one specific embodiment shown in FIG. 4, ARC material 46 includes an ARC layer 46b formed over an ARC layer 46a. ARC layer 46a is designed primarily for light absorption and thus parameters used during deposition of the layer are optimized to deposit an nitrogen-free ARC layer having a high extinction coefficient (k).

As discussed above, the extinction coefficient of the nitrogen-free ARC is related to the amount of silicon and hydrogen incorporated into the ARC among other factors. One way to increase the extinction coefficient is to increase the flow rate of the silicon source, such as silane, relative to the flow rate of the oxygen source. RF power, electrode spacing and chamber pressure also effect the extinction coefficient. Generally, any or all of lower RF power levels, closer electrode spacing and lower chamber pressure can be used to raise the extinction coefficient of the ARC.

Figure 4:
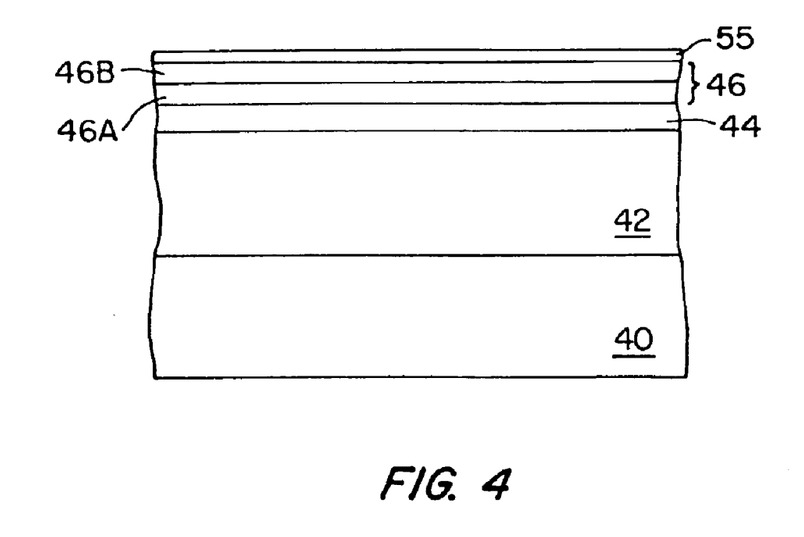
FIG. 4 is a simplified cross-sectional view of a substrate having additional layers useful in the photolithographic patterning processes formed over the substrate according to other embodiments of the invention.

In one embodiment layer 46a has a k value of between about 0.4 and 1.1 at deep UV wavelengths. ARC layer 46b, on the other hand, is designed primarily for phase shift cancellation. Specifically, properties of layer 46b cause reflections that cancel those generated at the interface between overlying material such as an overlying photoresist layer. Thus, the extinction coefficient of layer 46b is lower than that of layer 46a. In one specific embodiment, layer 46b has an extinction coefficient between about 0.2 and 0.5.

The thickness of ARC layers 46a and 46b varies depending on the application the layers are used for. In one embodiment the overall thickness of layer 46 is between about 250–1300 Å with layer 46a having a thickness of between about 100–300 Å and layer 46b having a thickness of between about 150–1000 Å. In contrast, hard mask layer 44 typically has a thickness of between about 500–5000 Å depending on the thickness of dielectric layer 42 that needs to be etched and the etch selectivity between hard mask layer 44 and dielectric layer 42.

Also shown in FIG. 4 is a silicon dioxide capping layer 55. Some embodiments of the invention form a thin silicon dioxide capping layer over ARC layer 46 in order to protect the ARC layer during the photoresist stripping process. Typical photoresist stripping processes expose the substrate to a plasma of activated oxygen. Such oxygen can react with the carbon in the ARC film to form $CO_2$, which is a volatile product that is exhausted from the chamber during the ashing process. The loss of carbon in the ARC layer may undesirably change the refractive and/or absorption indices of the ARC layer.

According to one embodiment, the silicon dioxide capping layer 55 is deposited over ARC layer 46 in a CVD process. In one specific embodiment, $SiO_2$ layer 54 is thin layer (e.g., between about 50–100 Å) formed from a plasma CVD process employing a process gas comprising $SiH_4$ and $CO_2$ with or without He. Other embodiments may employ other known silicon dioxide deposition gases and/or other inert gases. In another embodiment, the silicon dioxide layer 55 is a surface layer formed by exposing ARC layer 46 to an oxygen plasma. In one specific embodiment the surface $SiO_2$ layer is formed by exposing ARC layer 46 to a plasma formed from a gas comprising $CO_2$ and, optionally, He. In some embodiments the plasma treatment step lasts between 10–30 seconds.

Figure 5A:
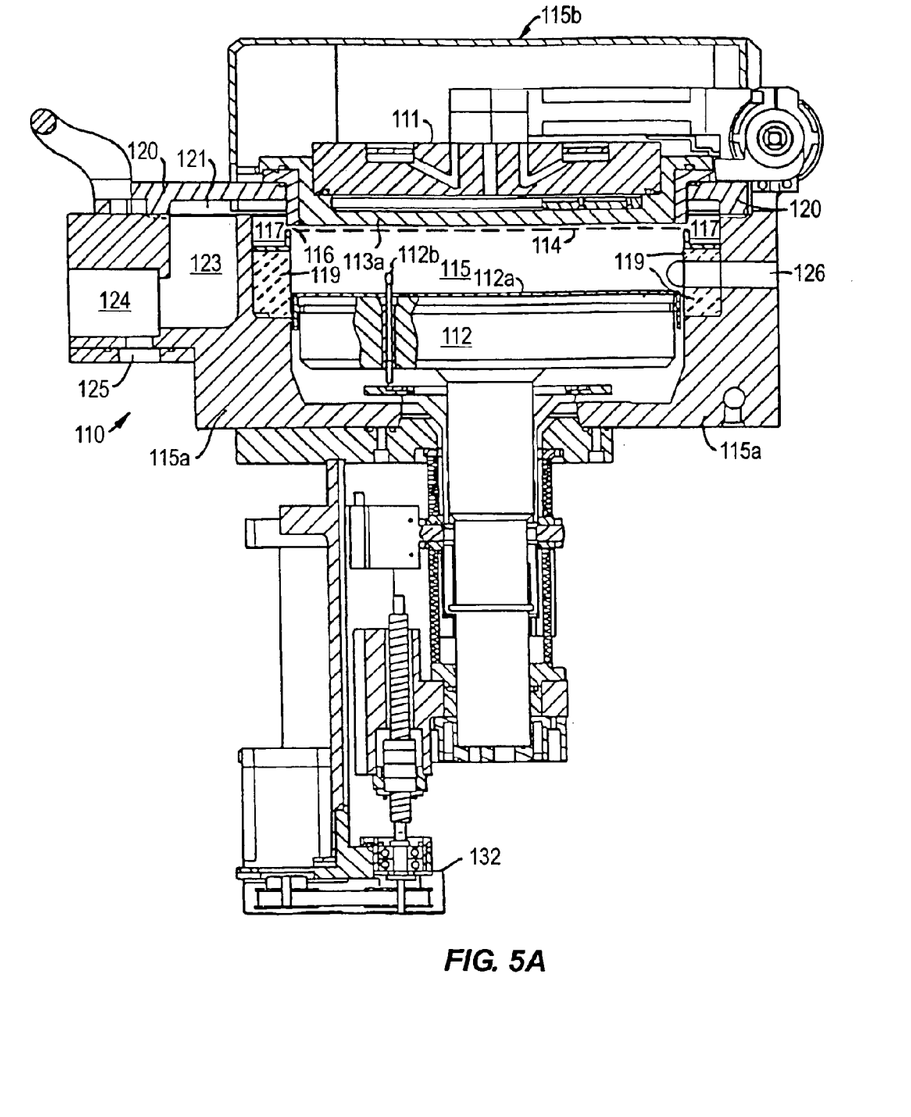
FIGS. 5A and 5B are simplified vertical, cross-sectional views of an exemplary plasma enhanced chemical vapor deposition apparatus that can be used to deposit a nitrogen-free ARC according to embodiments of the present invention.

As previously mentioned, the nitrogen-free ARC according to the present invention can be deposited in a variety of different plasma CVD chambers. An example of one suitable chamber is set forth below and discussed with respect to FIGS. 5A and 5B, which are vertical, cross-sectional views of a CVD system 110, having a vacuum or processing chamber 115 that includes a chamber wall 115a and chamber lid assembly 115b.

CVD system 110 contains a gas distribution manifold 111 for dispersing process gases to a substrate (not shown) that rests on a heated pedestal 112 centered within the process chamber. During processing, the substrate (e.g. a semiconductor wafer) is positioned on a flat (or slightly convex) surface 112a of pedestal 112. The pedestal can be moved controllably between a lower loading/off-loading position (depicted in FIG. 5A) and an upper processing position (indicated by dashed line 114 in FIG. 5A and shown in FIG. 5B), which is closely adjacent to manifold 111. A centerboard (not shown) includes sensors for providing information on the position of the wafers.

Deposition and carrier gases are introduced into chamber 115 through perforated holes of a conventional flat, circular gas distribution or faceplate 113a. More specifically, deposition process gases flow into the chamber through the inlet manifold 111 (indicated by arrow 140 in FIG. 1B), through a conventional perforated blocker plate 142 and then through holes 113b in gas distribution faceplate 113a.

Before reaching the manifold, deposition and carrier gases are input from gas sources 107 through gas supply lines 108 (FIG. 1B) into a mixing system 109 where they are combined and then sent to manifold 111. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 110 can be either a thermal process or a plasma-enhanced process. In a plasma-enhanced process, an RF power supply 144 applies electrical power between the gas distribution faceplate 113a and the pedestal so as to excite the process gas mixture to form a plasma within the cylindrical region between the faceplate 113a and the pedestal. (This region will be referred to herein as the "reaction region"). Constituents of the plasma react to deposit a desired film on the surface of the semiconductor wafer supported on pedestal 112. RF power supply 144 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 115. In a thermal process, RF power supply 144 would not be utilized, and the process gas mixture thermally reacts to deposit the desired films on the surface of the semiconductor wafer supported on pedestal 112, which is resistively heated to provide thermal energy for the reaction.

Figure 5B:
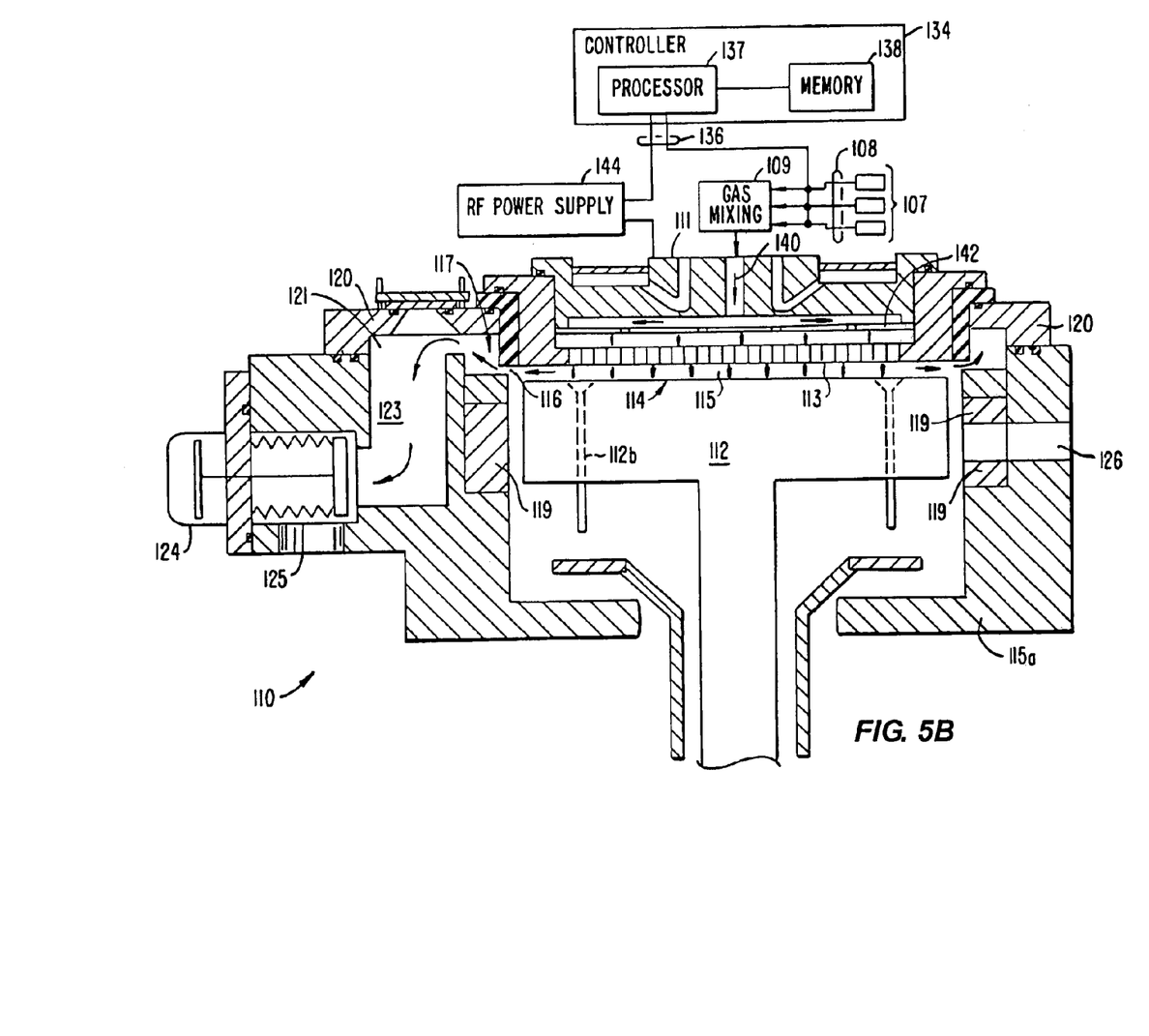

During a plasma-enhanced deposition process, the plasma heats the entire process chamber 110, including the walls of the chamber body 115 a surrounding the exhaust passageway 123 and the shut-off valve 124. When the plasma is not turned on or during a thermal deposition process, a hot liquid is circulated through the walls 115a of the process chamber to maintain the chamber at an elevated temperature. A portion of these heat exchanging passages 118 in the lid of chamber 110 is shown in FIG. 5B. The passages in the remainder of chamber walls 115a are not shown. Fluids used to heat the chamber walls 115a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 116 surrounding the reaction region and into an annular exhaust plenum 117. The annular slot 116 and the plenum 117 are defined by the gap between the top of the chamber's cylindrical side wall 115a (including the upper dielectric lining 119 on the wall) and the bottom of the circular chamber lid 120. The 360° circular symmetry and uniformity of the slot orifice 116 and the plenum 117 help achieve a uniform flow of process gases over the wafer so as to deposit a uniform film on the wafer.

From the exhaust plenum 117, the gases flow underneath a lateral extension portion 121 of the exhaust plenum 117, past a viewing port (not shown), through a downward-extending gas passage 123, past a vacuum shut-off valve 124 (whose body is integrated with the lower chamber wall 115a), and into the exhaust outlet 125 that connects to the external vacuum pump (not shown) through a foreline (also not shown).

The wafer support platter of the pedestal 112 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 112.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 132 (FIG. 1A) raises and lowers the heater pedestal assembly 112 and its wafer lift pins 112b as wafers are transferred into and out of the body of the chamber by a robot blade (not shown) through an insertion/removal opening 126 in the side of the chamber 110. The motor 132 raises and lowers pedestal 112 between a processing position 114 and a lower, wafer-loading position. The motor, valves or flow controllers connected to the supply lines 108, gas delivery system, throttle valve, RF power supply 144, and chamber and substrate heating systems are all controlled by a system controller 134 (FIG. 5B) over control lines 136, of which only some are shown. Controller 134 relies on feedback from optical sensors to determine the position of movable mechanical assemblies such as the throttle valve and susceptor which are moved by appropriate motors under the control of controller 134.

System controller 134 controls all of the activities of the CVD machine. The system controller executes system control software, which is a computer program stored in a computer-readable medium such as a memory 138. Preferably, memory 138 is a hard disk drive, but memory 138 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 134.

The above reactor description is mainly for illustrative purposes, and other types of plasma CVD equipment may be employed to form the ARC. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

In order to better appreciate and understand the present invention, several examples are set forth below in which nitrogen-free ARC according to embodiments of the invention are formed. These examples are meant to demonstrate and illustrate embodiments of the invention and are not intended to be restrictive.

EXAMPLE 1

In a first example a 270 Å thick nitrogen-free ARC was deposited having a refractive index of 1.70±0.1 and an extinction coefficient of 0.38. The ARC was deposited by forming a plasma from a process gas of $SiH_4$, $CO_2$ and He in a DxZ chamber manufactured by Applied Materials. The process gas included a flow of 70 sccm of $SiH_4$, 900 sccm of $CO_2$ and 3000 sccm of He and the plasma was formed by applying 210 Watts of 13.56 MHz RF power to gas manifold electrode. During the process, the substrate holder was maintained at a temperature of 350° C. and chamber pressure was maintained at 4.5 Torr.

The atomic concentration of the ARC as measured by Rutherford Back Scattering (RBS), a technique well known to those of skill in the art, was: 6.5% hydrogen, 1.6% carbon, 50.9% oxygen, 41.0% silicon and less than 1% nitrogen (no nitrogen was detected in the ARC but the measurement tool has sensitivity limit of 1%). The ARC had a density of $6.70 \times 10^{22}$ atoms/cm$^3$, a hydrogen-to-silicon ratio of 0.16:1 and a carbon-to-silicon ratio of 0.04:1.

EXAMPLE 2

In a second example a 500 Å thick nitrogen-free ARC was deposited having a refractive index of 1.70±0.1 and an extinction coefficient of 1.0. The ARC was deposited using a process similar to that in Example 1 except that the flows of the $SiH_4$, $CO_2$ and He sources were set at 98 sccm, 700 sccm and 3000 sccm, respectively. Pressure, temperature and RF power levels were the same as those used in Example 1.

The atomic concentration of the second ARC as measured using RBS techniques was: 12.6% hydrogen, 2.0% carbon, 40.8% oxygen, 44.6% silicon and less than 1% nitrogen (no nitrogen was detected in the ARC). The ARC had a density of $7.00 \times 10^{22}$ atoms/cm$^3$, a hydrogen-to-silicon ratio of 0.28:1 and a carbon-to-silicon ratio of 0.04:1.

EXAMPLE 3

In another set of experiments designed to determine the effectiveness of a capping layer at preventing changes to the ARC during the photoresist stripping process, a photoresist layer was formed over a nitrogen-free ARC and then removed using an oxygen ashing process. The oxygen ashing process was performed in a Producer chamber manufactured by Applied Materials at a temperature of 250° C., a pressure of 4 Torr and a wafer spacing of 600 mils. 500 Watts of RF power was applied to the upper electrode to form a plasma from a flow of 2600 sccm $O_2$ and 400 sccm He.

After removal of the photoresist layer, the thickness, refractive index and absorption coefficient of the ARC were measured. As a baseline for comparative testing, the first set of measurements was done on an ARC that was not capped in any manner. Table 2 listed below compares these baseline measurements to those taken on an identically deposited ARC that was capped with a 50 Å silicon dioxide capping layer formed by a plasma CVD process and an identically deposited ARC that was capped with a thin silicon dioxide surface layer formed by exposing the ARC to a $CO_2$ plasma treatment for 20 seconds. Both capping structures were formed on the ARC prior to the formation of the photoresist layer.

TABLE 2

EXPERIMENT 3 MEASURED VALUES

| Film Stack | As Deposited | | | After Ashing | | | Change | | |
|---|---|---|---|---|---|---|---|---|---|
| | t (Å) | n | k | t (Å) | n | k | )t | )n | )k |
| Baseline | 443 | 1.86 | 0.59 | 421 | 1.83 | 0.61 | −22 | −0.04 | 0.01 |
| 50 Å Cap Oxide | 472 | 1.80 | 0.61 | 472 | 1.79 | 0.60 | 0 | −0.01 | −0.01 |
| Surface Treatment | 460 | 1.84 | 0.61 | 446 | 1.82 | 0.61 | −14 | −0.02 | 0.01 |

As is evident from Table 2 above, both capping processes beneficially reduced the change in film thickness, refractive index and extinction coefficient caused by the ashing process.

The specific gas flow rates and other film deposition parameters discussed above are optimized for deposition processes run in a DxZ chamber manufactured by Applied Materials and outfitted for 200 mm wafers. A person of ordinary skill in the art will recognize that the rates at which various precursor gases in the process gas are introduced are in part chamber specific and will vary if chambers of other design and/or volume are employed.

Having fully described several embodiments of the present invention, many other equivalents or alternative embodiments of the invention will be apparent to those skilled in the art. For example, while the invention examples described above used $SiH_4$ and $CO_2$ as source gases other silicon and oxygen sources may be used. For example, an oxygen source such as TEOS, $O_2$, CO, $O_3$, $H_2O$ vapor or others can be used instead of $CO_2$ and a silicon source other than monosilane may be used. Examples of suitable silicon sources include other silane family members such as, $Si_2H_6$, $Si_3H_8$, etc.; TEOS and $SiF_4$ among others. Also, while the invention was described in conjunction with the formation of a dual damascene structure, it can be used in a variety of other applications. For example, in one embodiment, a nitrogen-free ARC according to the present invention is formed over a silicon nitride hard mask for gate and bitline applications. In another embodiment, a nitrogen-free ARC is formed over a polysilicon hardmask layer for oxide contact applications. As such, the above description is illustrative and not restrictive. These equivalents and/or alternatives are intended to be included within the scope of the present invention.

What is claimed is:

1. A layer of antireflective coating (ARC) material for use in photolithographic processing, said layer of ARC material having the formula $Si_wO_xH_y:C_z$, wherein w, x, y and z represent the atomic percentage of silicon, oxygen, hydrogen and carbon, respectively; wherein w is between 35 and 55, x is between 35 and 55, y is between 4 and 15, z is between 0 and 3 and the atomic percentage of nitrogen in said layer of ARC material is less than or equal to 1 atomic percent.

2. The antireflective coating of claim 1 wherein the refractive index (n) of said ARC material is less than about 2.0 at 193 nm.

3. The antireflective coating of claim 2 wherein the refractive index (n) of said ARC material is between 1.5 and 1.9 at 193 nm.

4. The antireflective coating of claim 3 wherein w is between 40 and 45, x is between 40 and 54, y is between 6–13 and the atomic percentage of nitrogen is less than or equal to 0.1 atomic percent.

5. The antireflective coating of claim 3 wherein the extinction coefficient (k) of said ARC material is between 0.1 and 1.1.

6. The antireflective coating of claim 1 wherein said layer has a thickness less than or equal to 1200 Å.

7. A method for fabricating an integrated circuit, the method comprising:
   depositing an antireflective coating (ARC) over a substrate using a chemical vapor deposition process, said ARC having the formula $Si_wO_xH_y:C_z$, wherein w, x, y and z represent the atomic percentage of silicon, oxygen, hydrogen and carbon, respectively; wherein w is between 35 and 55, x is between 35 and 55, y is between 4 and 15, z is between 0 and 3 and the atomic percentage of nitrogen in said ARC is less than or equal to 1 atomic percent;
   forming a layer of photoresist over the ARC; and
   patterning said photoresist layer.

8. The method of fabricating an integrated circuit according to claim 7 wherein said patterning step comprises exposing said photoresist layer to deep UV radiation through a patterned mask and thereafter developing the exposed photoresist layer to produce a pattern.

9. The method of fabricating an integrated circuit according to claim 8 wherein the ARC is deposited over a dielectric layer formed on the substrate and wherein the method of fabricating the integrated circuit further comprises transferring the pattern formed in the photoresist layer to the antireflective coating and into the dielectric layer.

10. The method of claim 9 wherein the dielectric layer is selected from the group consisting of a SiC, a SiOC and a spin-on dielectric material having a dielectric constant of 3.5 or less.

11. The method of fabricating an integrated circuit according to claim 9 further comprising depositing a hard mask layer over the dielectric layer prior to depositing the ARC.

12. The method of fabricating an integrated circuit according to claim 7 further comprising, prior to forming the photoresist layer, forming a silicon dioxide cap layer over the ARC.

13. The method of fabricating an integrated circuit according to claim 12 wherein the step of forming a silicon dioxide cap layer comprises exposing the ARC to a plasma formed from a gas comprising an oxygen-source to form a surface layer of silicon dioxide.

14. The method of fabricating an integrated circuit according to claim 12 wherein the step of forming a silicon dioxide cap layer comprises depositing the silicon dioxide layer over the ARC using a chemical vapor deposition process.

15. The method of fabricating an integrated circuit according to claim 7 wherein the ARC comprises a first layer having a first extinction coefficient and a second layer having a second extinction coefficient, the second layer being deposited directly on the first layer and the first extinction coefficient being higher than the second extinction coefficient.

16. The method of fabricating an integrated circuit according to claim 15 wherein the first extinction coefficient is between about 0.4 to 1.1 inclusive and the second extinction coefficient is between about 0.1 to 0.5 inclusive.

17. The method of fabricating an integrated circuit according to claim 7 wherein the ARC is deposited from a plasma formed from a process gas comprising $SiH_4$ and $CO_2$.

18. A method for fabricating an integrated circuit, the method comprising:
   depositing an antireflective coating (ARC) layer over a substrate using a chemical vapor deposition process, said ARC layer comprising a second layer deposited over a first layer, wherein each of said first and second ARC layers can be represented by a formula $Si_wO_xH_y:C_z$, wherein w, x, y and z represent the atomic percentage of silicon, oxygen, hydrogen and carbon, respectively; wherein w is between 35 and 55, x is between 35 and 55, y is between 4 and 15, z is between 0 and 3 and wherein (i) the atomic percentage of nitrogen in each of the first and second ARC layers is less than or equal to 1 atomic percent and (ii) the first layer has a first extinction coefficient and the second layer has a second extinction coefficient that is lower than the first extinction coefficient;
   forming a silicon dioxide capping layer on the second ARC layer;
   forming a layer of photoresist over the ARC and silicon dioxide capping layer; and
   patterning said photoresist layer by exposing said photoresist layer to deep UV radiation through a patterned mask and thereafter developing the exposed photoresist layer to produce a pattern.

19. The method of fabricating an integrated circuit according to claim 18 wherein a refractive index (n) of each of the first and second ARC layers is between 1.5 and 1.9.

20. The method of fabricating an integrated circuit according to claim 19 wherein the first extinction coefficient is between about 0.4 to 1.1 inclusive and the second extinction coefficient is between about 0.1 to 0.5 inclusive.

21. The method of fabricating an integrated circuit according to claim 19 wherein, for each of the first and second ARC layers, w is between 40 and 45, x is between 40 and 54, y is between 6–13 and the atomic percentage of nitrogen is less than or equal to 0.1 atomic percent.

22. The method of fabricating an integrated circuit according to claim 19 further comprising the step of forming an amorphous carbon hard mask layer over the substrate prior to depositing the antireflective coating.

23. A method for fabricating an integrated circuit, the method comprising:
   depositing an amorphous carbon hard mask over a substrate;
   depositing an antireflective coating (ARC) over the amorphous carbon hard mask using a chemical vapor deposition process, said ARC layer having the formula $Si_wO_xH_y:C_z$, wherein w, x, y and z represent the atomic percentage of silicon, oxygen, hydrogen and carbon, respectively; wherein w is between 35 and 55, x is between 35 and 55, y is between 4 and 15, z is between 0 and 3 and the atomic percentage of nitrogen in said ARC is less than or equal to 1 atomic percent;
   forming a capping layer on the ARC;
   forming a layer of photoresist over the ARC and capping layer; and
   patterning said photoresist layer by exposing said photoresist layer to deep UV radiation through a patterned mask and thereafter developing the exposed photoresist layer to produce a pattern.

24. The method of fabricating an integrated circuit according to claim 23 wherein said ARC comprises a second layer deposited over a first layer with each of said first and second ARC layers representable by a formula $Si_wO_xH_y:C_z$, wherein w, x, y and z represent the atomic percentage of silicon, oxygen, hydrogen and carbon, respectively; wherein w is between 35 and 55, x is between 35 and 55, y is between 4 and 15, z is between 0 and 3 and wherein (i) the atomic percentage of nitrogen in each of the first and second ARC layers is less than or equal to 1 atomic percent and (ii) the first layer has a first extinction coefficient and the second layer has a second extinction coefficient that is lower than the first extinction coefficient.

25. The method of fabricating an integrated circuit according to claim 24 wherein the amorphous carbon hard mask layer is deposited over a dielectric layer to be patterned.

26. The method of fabricating an integrated circuit according to claim 25 wherein the patterning step produces a first pattern in said photoresist layer and wherein the method further comprises transferring said first pattern into said dielectric layer thereby etching a hole through said capping layer, through said ARC and through said hard mask.

27. The method of fabricating an integrated circuit according to claim 26 further comprising:
   after transferring said first pattern into said dielectric layer, removing said photoresist layer;
   forming a second photoresist layer over said substrate and in said hole; and
   patterning said second photoresist layer according to a second pattern.

28. The method of fabricating an integrated circuit according to claim 27 further comprising transferring the second pattern into said dielectric layer.

29. The method of claim 28 wherein said first pattern is a via pattern and said second pattern is a trench pattern.

30. The method of claim 28 wherein said first pattern is a trench pattern and said second pattern is a via pattern.

31. The method of fabricating an integrated circuit according to claim 28 wherein the step of forming a capping layer comprises exposing the ARC layer to an oxygen-containing plasma to form a surface layer of silicon dioxide on the ARC.

32. The method of fabricating an integrated circuit according to claim 28 wherein the step of forming a capping layer comprises depositing a silicon dioxide layer over the ARC layer using a chemical vapor deposition process.

* * * * *